United States Patent
Chen et al.

(10) Patent No.: US 10,642,579 B2
(45) Date of Patent: May 5, 2020

(54) NON-VOLATILE MEMORY

(71) Applicant: eMemory Technology Inc., Hsin-Chu (TW)

(72) Inventors: Chih-Hsin Chen, Changhua County (TW); Shih-Chen Wang, Taipei (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 15/989,382

(22) Filed: May 25, 2018

(65) Prior Publication Data

US 2019/0115076 A1  Apr. 18, 2019

Related U.S. Application Data

(60) Provisional application No. 62/571,833, filed on Oct. 13, 2017.

(51) Int. Cl.
| | |
|---|---|
| *G11C 11/34* | (2006.01) |
| *G06F 7/58* | (2006.01) |
| *G11C 17/18* | (2006.01) |
| *G11C 17/16* | (2006.01) |
| *G11C 5/14* | (2006.01) |

(Continued)

(52) U.S. Cl.
CPC ............... *G06F 7/588* (2013.01); *G11C 5/14* (2013.01); *G11C 7/1084* (2013.01); *G11C 16/0408* (2013.01); *G11C 16/0433* (2013.01); *G11C 16/06* (2013.01); *G11C 16/10* (2013.01); *G11C 16/26* (2013.01); *G11C 16/30* (2013.01); *G11C 17/16* (2013.01); *G11C 17/165* (2013.01); *G11C 17/18* (2013.01); *H01L 27/11519* (2013.01)

(58) Field of Classification Search
CPC ......... G06F 7/588; G11C 5/14; G11C 7/1084; G11C 16/0408; G11C 16/0433; G11C 16/06; G11C 16/10; G11C 16/26; G11C 16/30; G11C 17/16; G11C 17/165; G11C 17/18
USPC .............................................. 365/185.05, 63
See application file for complete search history.

(56) References Cited

U.S. PATENT DOCUMENTS

| | | | | |
|---|---|---|---|---|
| 4,845,680 A | * | 7/1989 | Iwahashi | G11C 16/0433 365/185.23 |
| 5,126,969 A | * | 6/1992 | Kawana | G11C 7/24 365/185.08 |

(Continued)

*Primary Examiner* — Viet Q Nguyen
(74) *Attorney, Agent, or Firm* — WPAT, PC

(57) ABSTRACT

A non-volatile memory includes a memory cell. A storage element of the memory cell has following structures. A first floating gate transistor includes a first floating gate, a first source/drain terminal and a second source/drain terminal. A second floating gate transistor includes the first floating gate, a third source/drain terminal and a fourth source/drain terminal. A third floating gate transistor includes a second floating gate, a fifth source/drain terminal and a sixth source/drain terminal. A fourth floating gate transistor includes the second floating gate, a seventh source/drain terminal and an eighth source/drain terminal. The first and third source/drain terminals are connected with a first terminal of the storage element. The second and fifth source/drain terminals are connected with each other. The fourth and seventh source/drain terminals are connected with each other. The sixth and eighth source/drain terminals are connected with a second terminal of the storage element.

5 Claims, 6 Drawing Sheets

(51) Int. Cl.
*G11C 7/10* (2006.01)
*G11C 16/04* (2006.01)
*G11C 16/10* (2006.01)
*G11C 16/26* (2006.01)
*G11C 16/30* (2006.01)
*G11C 16/06* (2006.01)
*H01L 27/11519* (2017.01)

(56) References Cited

U.S. PATENT DOCUMENTS

| | | | | |
|---|---|---|---|---|
| 5,982,661 | A * | 11/1999 | Kawamata | G11C 16/26 365/185.01 |
| 6,963,503 | B1 * | 11/2005 | Rahim | G11C 16/0441 365/185.05 |
| 7,016,219 | B1 * | 3/2006 | Davies, Jr. | G11C 14/00 365/149 |
| 7,209,392 | B2 * | 4/2007 | Chen | G11C 16/0441 257/E27.103 |
| 7,460,396 | B2 | 12/2008 | Oka et al. | |
| 7,968,926 | B2 | 6/2011 | Huang et al. | |
| 7,983,081 | B2 * | 7/2011 | Fang | G11C 16/02 257/316 |
| 8,228,726 | B2 * | 7/2012 | Fang | G11C 16/0466 257/315 |
| 8,363,475 | B2 * | 1/2013 | Chen | G11C 16/0458 365/185.18 |
| 8,456,916 | B2 * | 6/2013 | Chen | G11C 16/0458 365/185.18 |
| 8,730,728 | B2 * | 5/2014 | Kang | G11C 16/045 365/185.11 |
| 8,941,167 | B2 * | 1/2015 | Chen | H01L 29/42328 257/315 |
| 8,947,938 | B2 * | 2/2015 | Lee | H01L 27/11521 365/185.18 |
| 9,041,089 | B2 * | 5/2015 | Chen | H01L 27/11524 257/315 |
| 9,058,891 | B2 * | 6/2015 | Kang | G11C 16/26 |
| 9,153,327 | B2 * | 10/2015 | Ching | G11C 16/12 |
| 9,368,506 | B2 * | 6/2016 | Mikalo | G11C 16/045 |
| 9,425,204 | B2 * | 8/2016 | Ching | H01L 29/7881 |
| 9,524,785 | B2 * | 12/2016 | Chen | G11C 16/14 |
| 9,653,172 | B2 * | 5/2017 | Lee | G11C 16/28 |
| 9,653,173 | B1 * | 5/2017 | Lo | G11C 16/16 |
| 9,767,914 | B1 * | 9/2017 | Leung | G11C 16/10 |
| 9,941,011 | B2 * | 4/2018 | Lai | G11C 16/12 |
| 10,224,108 | B2 * | 3/2019 | Ching | G11C 7/04 |
| 2006/0138245 | A1 * | 6/2006 | Lee | G11C 11/005 235/492 |
| 2006/0171203 | A1 * | 8/2006 | Lee | G11C 16/0408 365/185.17 |
| 2010/0157669 | A1 * | 6/2010 | Audzeyeu | G11C 16/0441 365/185.1 |
| 2011/0310669 | A1 * | 12/2011 | Ching | G11C 16/0441 365/185.15 |
| 2012/0063233 | A1 * | 3/2012 | Lee | G11C 16/0441 365/185.22 |
| 2012/0236646 | A1 * | 9/2012 | Hsu | G11C 16/0441 365/185.14 |
| 2014/0177338 | A1 * | 6/2014 | Ching | G11C 16/0441 365/185.14 |

* cited by examiner

| | CL | EL | Sel | WL | SL | BL |
|---|---|---|---|---|---|---|
| PGM | Vpp | Vpp | Vdd | Vdd | 0V | 0V |
| PGM inhibit | Vpp | Vpp | Vdd | Vdd | Vdd | Vdd |
| ERS | 0V | Vpp | Vdd | Vdd | 0V | 0V |
| READ | 0V | 0V | Vdd | Vdd | 0V | Vdd |

|  | CL | EL | Sel | WL | SL | BL |
|---|---|---|---|---|---|---|
| PGM | Vpp | Vpp | Vdd | Vdd | 0V | 0V |
| PGM inhibit | Vpp | Vpp | Vdd | Vdd | Vdd | Vdd |
| ERS | 0V | Vpp | Vdd | Vdd | 0V | 0V |
| READ | 0V | 0V | Vdd | Vdd | 0V | Vdd |

NON-VOLATILE MEMORY

This application claims the benefit of U.S. provisional application Ser. No. 62/571,833, filed Oct. 13, 2017, the subject matter of which is incorporated herein by reference.

FIELD OF THE INVENTION

The present invention relates to a non-volatile memory, and more particularly to a non-volatile memory with plural floating gate transistors in each memory cell.

BACKGROUND OF THE INVENTION

As is well known, a memory cell of a non-volatile memory uses a floating gate transistor as a storage element. During a program action of the non-volatile memory, carriers are injected into the floating gate of the floating gate transistor. During an erase action of the non-volatile memory, carriers are ejected from the floating gate of the floating gate transistor. During a read action of the non-volatile memory, the storage state of the memory cell is determined according to the amount of the carriers stored in the floating gate.

Moreover, the manufacturer of the non-volatile memory designs many kinds of memory cells to increase the reliability of the memory cells. For example, the storage element of the memory cell comprises two floating gate transistors. The floating gate transistors store the same data. During the read action, the storage state of the memory cell is capable of being determined according to anyone of the floating gate transistors. Consequently, the reliability of the memory cell is enhanced.

SUMMARY OF THE INVENTION

An embodiment of the present invention provides a non-volatile memory. The non-volatile memory includes a memory cell. The storage element includes p×q floating gate transistors. The q floating gate transistors in each row are serially connected between a first terminal and a second terminal of the storage element. The x-th floating gate transistors in each row share an x-th floating gate, wherein x is an integer, and $1 \leq x \leq q$.

Another embodiment of the present invention provides a non-volatile memory. The non-volatile memory includes a memory cell. The memory cell includes a storage element. The storage element includes p×q floating gate transistors. The q floating gate transistors in the y-th row are serially connected between a (2y−1)-th terminal and a (2y)-th terminal of the storage element, wherein y is an integer, and $1 \leq y \leq p$. The x-th floating gate transistors in each row share an x-th floating gate, wherein x is an integer, and $1 \leq x \leq q$.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a non-volatile memory. Each memory cell of the non-volatile memory comprises a storage element. Each storage element comprises plural floating gate transistors.

Figure 1:
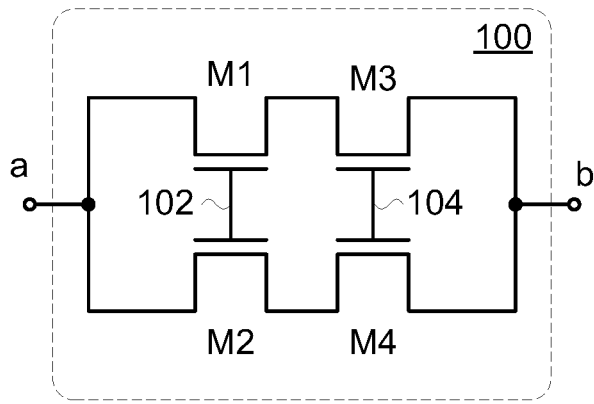
FIG. 1 is a schematic circuit diagram illustrating an equivalent circuit of a storage element in a memory cell of a non-volatile memory according to a first embodiment of the present invention.

FIG. 1 is a schematic circuit diagram illustrating an equivalent circuit of a storage element in a memory cell of a non-volatile memory according to a first embodiment of the present invention. As shown in FIG. 1, the storage element 100 comprises four floating gate transistors M1, M2, M3 and M4. The first source/drain terminal of the floating gate transistor M1 is connected with a first terminal a of the storage element. The first source/drain terminal of the floating gate transistor M2 is also connected with the first terminal a of the storage element. Moreover, the floating gate of the floating gate transistor M1 and the floating gate of the floating gate transistor M2 are connected with each other. That is, the floating gate transistor M1 and the floating gate transistor M2 have a shared floating gate 102.

The first source/drain terminal of the floating gate transistor M3 is connected with the second source/drain terminal of the floating gate transistor M1. The second source/drain terminal of the floating gate transistor M3 is connected with a second terminal b of the storage element. The first source/drain terminal of the floating gate transistor M4 is connected with the second source/drain terminal of the floating gate transistor M2. The second source/drain terminal of the floating gate transistor M4 is connected with the second terminal b of the storage element. Moreover, the floating gate of the floating gate transistor M3 and the floating gate of the floating gate transistor M4 are connected with each other. That is, the floating gate transistor M4 and the floating gate transistor M4 have a shared floating gate 104.

During a program action of the non-volatile memory, carriers are injected into both of the two floating gates 102 and 104. During an erase action of the non-volatile memory, carriers are ejected from both of the two floating gates 102 and 104. During a read action of the non-volatile memory, the storage state of the memory cell is determined according to the amount of the carriers stored in the two floating gates 102 and 104. For example, the carriers are electrons.

Figure 2A:
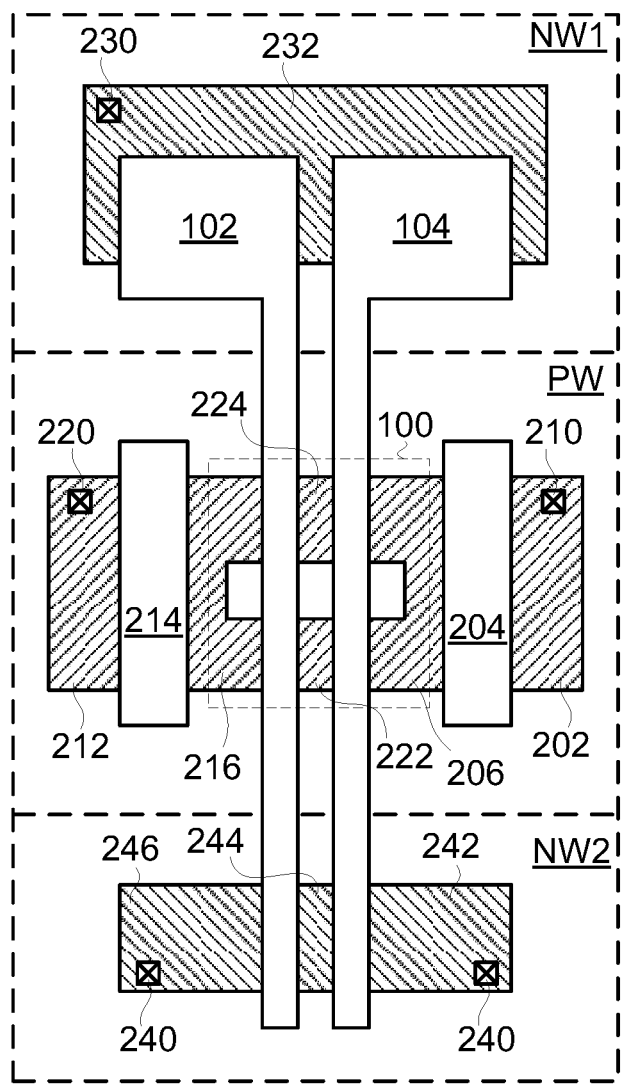
FIG. 2A is a schematic top view illustrating a memory cell of a non-volatile memory according to the first embodiment of the present invention.
Figures 2B, 2C:
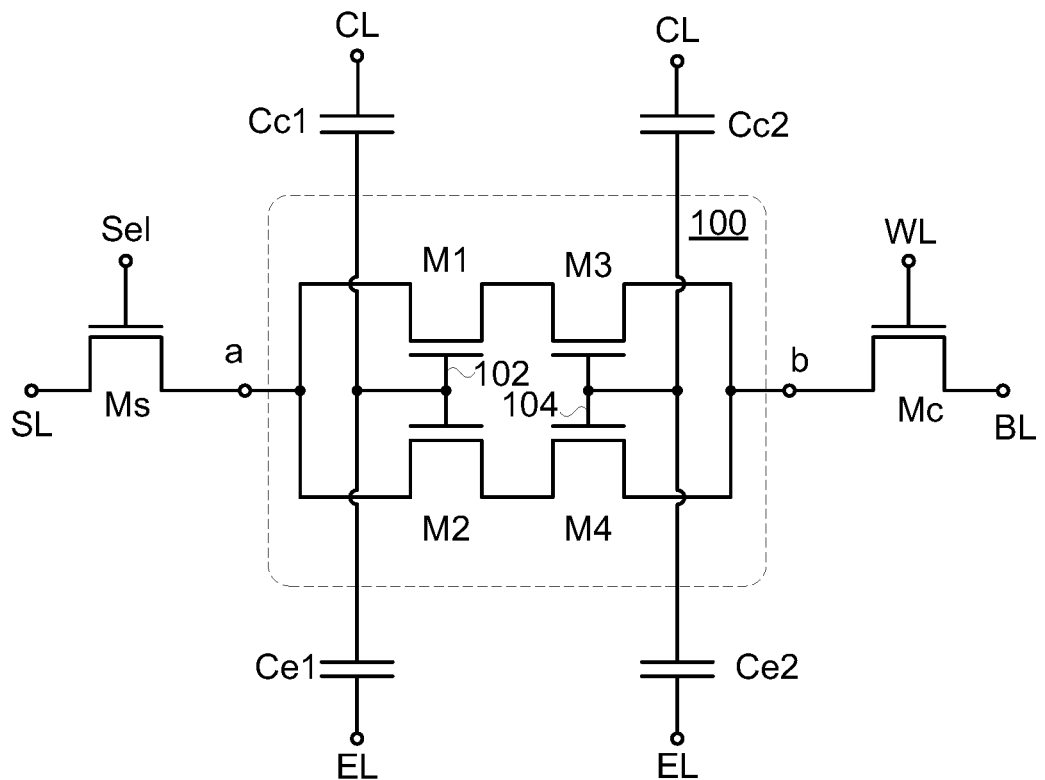
FIG. 2B is a circuit diagram illustrating an equivalent circuit of the memory cell according to the first embodiment of the present invention.
FIG. 2C is a bias voltage table illustrating the bias voltages for performing a program action, a program inhibition, an erase action and a read action on the memory cell of the non-volatile memory according to the first embodiment of the present invention.

FIG. 2A is a schematic top view illustrating a memory cell of a non-volatile memory according to the first embodiment of the present invention. FIG. 2B is a circuit diagram illustrating an equivalent circuit of the memory cell according to the first embodiment of the present invention. FIG. 2C is a bias voltage table illustrating the bias voltages for performing a program action, a program inhibition, an erase action and a read action on the memory cell of the non-volatile memory according to the first embodiment of the present invention.

As shown in FIG. 2A, six n-type doped regions 202, 206, 212, 216, 222 and 224 are formed in a p-well region PW.

A gate 204 is spanned over the n-type doped regions 202 and 206. Consequently, the gate 204 and the n-type doped regions 202 and 206 are collaboratively defined as a control transistor Mc. Moreover, the gate 204 is connected with a word line WL. A conductor line 210 is connected with the n-type doped region 202. Moreover, the conductor line 210 is used as a bit line BL. In an embodiment, the control transistor Mc is an n-type transistor.

A gate 214 is spanned over the n-type doped regions 212 and 216. Consequently, the gate 214 and the n-type doped regions 212 and 216 are collaboratively defined as a select transistor Ms. Moreover, the gate 214 is connected with a select line Sel. A conductor line 220 is connected with the n-type doped region 212. Moreover, the conductor line 220 is used as a source line SL. In an embodiment, the select transistor Ms is an n-type transistor.

The floating gate 102 is spanned over the n-type doped regions 216 and 224. Consequently, the floating gate 102 and the n-type doped regions 216 and 224 are collaboratively defined as the floating gate transistor M1.

The floating gate 102 is also spanned over the n-type doped regions 216 and 222. Consequently, the floating gate 102 and the n-type doped regions 216 and 222 are collaboratively defined as the floating gate transistor M2.

The floating gate 104 is spanned over the n-type doped regions 224 and 206. Consequently, the floating gate 104 and the n-type doped regions 224 and 206 are collaboratively defined as the floating gate transistor M3.

The floating gate 104 is also spanned over the n-type doped regions 222 and 206. Consequently, the floating gate 104 and the n-type doped regions 222 and 206 are collaboratively defined as the floating gate transistor M4. In other words, the region 100 as shown in FIG. 2A denotes the storage element of the memory cell.

Moreover, a p-type doped region 232 is formed in a first n-well region NW1. A conductor line 230 is connected with the p-type doped region 232. The conductor line 230 is used as a control line CL. The floating gate 102 and the p-type doped region 232 are collaboratively defined as a capacitor Cc1. A terminal of the capacitor Cc1 is connected with the control line CL. The other terminal of the capacitor Cc1 is connected with the floating gate 102.

Similarly, the floating gate 104 and the p-type doped region 232 are collaboratively defined as a capacitor Cc2. A terminal of the capacitor Cc2 is connected with the control line CL. The other terminal of the capacitor Cc2 is connected with the floating gate 104.

Moreover, p-type doped regions 242, 244 and 246 are formed in a second n-well region NW2. A conductor line 240 is connected with the p-type doped regions 242 and 246. The conductor line 240 is used as an erase line EL.

The floating gate 102 and the p-type doped regions 246 and 244 are collaboratively defined as a capacitor Ce1. A terminal of the capacitor Ce1 is connected with the erase line EL. The other terminal of the capacitor Ce1 is connected with the floating gate 102.

Similarly, the floating gate 104 and the p-type doped regions 244 and 242 are collaboratively defined as a capacitor Ce2. A terminal of the capacitor Ce2 is connected with the erase line EL. The other terminal of the capacitor Ce2 is connected with the floating gate 104.

Please refer to the equivalent circuit of FIG. 2B. The first source/drain terminal of the control transistor Mc is connected with the bit line BL. The gate of the control transistor Mc is connected with the word line WL. The second source/drain terminal of the control transistor Mc is connected with the second terminal b of the storage element 100. The first source/drain terminal of the select transistor Ms is connected with the source line SL. The gate of the select transistor Ms is connected with the select line Sel. The second source/drain terminal of the select transistor Ms is connected with the first terminal a of the storage element 100. The capacitor Cc1 is connected between the floating gate 102 and the control line CL. The capacitor Cc2 is connected between the floating gate 104 and the control line CL. The capacitor Ce1 is connected between the floating gate 102 and the erase line EL. The capacitor Ce2 is connected between the floating gate 104 and the erase line EL.

FIG. 2C is a bias voltage table illustrating the bias voltages for performing a program action, a program inhibition, an erase action and a read action on the selected memory cell. While each of the program action, the program inhibition, the erase action and the read action is performed, the p-well region PW receives the ground voltage (0V), the first n-well region NW1 and the control line CL receive the same voltage, and the second n-well region NW2 and the erase line EL receive the same voltage.

When the program action (PGM) is performed, carriers are injected into the two floating gates 102 and 104. Consequently, the memory cell is in a first storage state. When the program inhibition (PGM inhibit) is performed, the carriers are prevented from being injected into the two floating gates 102 and 104. Consequently, the memory cell is in a second storage state.

When the program action (PGM) is performed, a power voltage Vpp is provided to the control line CL and the erase line EL, a power voltage Vdd is provided to the word line WL and the select line Sel, and the ground voltage (0V) is provided to the bit line BL and the source line SL. The power voltage Vpp is higher than the power voltage Vdd. For example, the power voltage Vpp is in the range between 9V and 24V, and the power voltage Vdd is in the range between 0.7V and 6V.

Since the word line WL receives the power voltage Vdd and the bit line BL receives the ground voltage (0V), the control transistor Mc is turned on. Similarly, since the select line Sel receives the power voltage Vdd and the source line SL receives the ground voltage (0V), the select transistor Ms is turned on.

When both of the control transistor Mc and the select transistor Ms are turned on, the voltage difference between the floating gate 102 of the floating gate transistors M1 and M2 and the corresponding source/drain terminal is equal to Vpp and the voltage difference between the floating gate 104 of the floating gate transistors M3 and M4 and the corresponding source/drain terminal is equal to Vpp. Consequently, the channel regions of the floating gate transistors M1, M2, M3 and M4 result in a Fowler-Nordheim tunneling effect (i.e., the FN tunneling effect). The carriers are injected into the floating gates 102 and 104 through the channel regions. That is, after the program action is completed, the carriers are stored in the floating gates 102 and 104. For example, the carriers are electrons.

When the program inhibition (PGM inhibit) is performed, the power voltage Vpp is provided to the control line CL and the erase line EL, and the power voltage Vdd is provided to the word line WL, the select line Sel, the bit line BL and the source line SL.

Since the word line WL and the bit line BL receive the power voltage Vdd, the control transistor Mc is turned off. Similarly, since the select line Sel and the source line SL receive the power voltage Vdd, the select transistor Ms is turned off. Consequently, the channel regions of the floating gate transistors M1, M2, M3 and M4 do not result in the FN tunneling effect. The carriers cannot be injected into the floating gates 102 and 104 through the channel regions. That is, after the program inhibition is completed, the carriers are not stored in the floating gates 102 and 104.

When the erase action (ERS) is performed, a power voltage Vpp is provided to the erase line EL, a power voltage Vdd is provided to the word line WL and the select line Sel, and the ground voltage (0V) is provided to the control line CL, the bit line BL and the source line SL.

Since the erase line receives the power voltage Vpp and the control line CL receives the ground voltage (0V), the capacitors Ce1 and Ce2 result in the FN tunneling effect. The carriers are transferred to the erase line EL through the capacitors Ce1 and Ce2 and exited from the floating gates 102 and 104. After the erase action is completed, the carriers are ejected from the floating gates 102 and 104.

When the read action (READ) is performed, a power voltage Vdd is provided to the bit line BL, the word line WL and the select line Sel, and the ground voltage (0V) is provided to the control line CL, the erase line EL and the source line SL.

According to the amount of the carriers stored in the floating gates 102 and 104, the floating gate transistors M1~M4 generate read currents with different magnitudes to the bit line BL.

In a situation, carriers are stored in the floating gates 102 and 104. When the read action is performed, the floating gate transistors M1 and M3 generate a first read current and the floating gate transistors M2 and M4 generate a second read current. After a first read current and a second read current are added together, a first summation circuit is generated to the bit line BL.

In another situation, carriers are not stored in the floating gates 102 and 104. When the read action is performed, the floating gate transistors M1 and M3 generate a third read current and the floating gate transistors M2 and M4 generate a fourth read current. After a third read current and a fourth read current are added together, a second summation circuit is generated to the bit line BL.

In an embodiment, the first summation circuit is lower than the second summation circuit. In case that the lower current is generated by the bit line BL, it means that the memory cell is in the first storage state. In case that the higher current is generated by the bit line BL, it means that the memory cell is in the second storage state.

Figure 3:
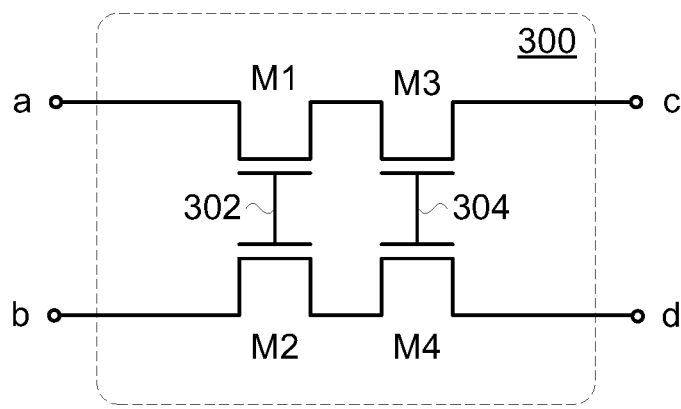
FIG. 3 is a schematic circuit diagram illustrating an equivalent circuit of a storage element in a memory cell of a non-volatile memory according to a second embodiment of the present invention.

FIG. 3 is a schematic circuit diagram illustrating an equivalent circuit of a storage element in a memory cell of a non-volatile memory according to a second embodiment of the present invention. As shown in FIG. 3, the storage element 300 comprises four floating gate transistors M1, M2, M3 and M4. The first source/drain terminal of the floating gate transistor M1 is connected with a first terminal a of the storage element. The first source/drain terminal of the floating gate transistor M2 is connected with a second terminal b of the storage element. Moreover, the floating gate of the floating gate transistor M1 and the floating gate of the floating gate transistor M2 are connected with each other. That is, the floating gate transistor M1 and the floating gate transistor M2 have a shared floating gate 302.

The first source/drain terminal of the floating gate transistor M3 is connected with the second source/drain terminal of the floating gate transistor M1. The second source/drain terminal of the floating gate transistor M3 is connected with a third terminal c of the storage element. The first source/drain terminal of the floating gate transistor M4 is connected with the second source/drain terminal of the floating gate transistor M2. The second source/drain terminal of the floating gate transistor M4 is connected with a fourth terminal d of the storage element. Moreover, the floating gate of the floating gate transistor M3 and the floating gate of the floating gate transistor M4 are connected with each other. That is, the floating gate transistor M3 and the floating gate transistor M4 have a shared floating gate 304.

During a program action of the non-volatile memory, carriers are injected into both of the two floating gates 302 and 304. During an erase action of the non-volatile memory, carriers are ejected from both of the two floating gates 302 and 304. During a read action of the non-volatile memory, the storage state of the memory cell is determined according to the amount of the carriers stored in the two floating gates 302 and 304. For example, the carriers are electrons.

Figure 4A:
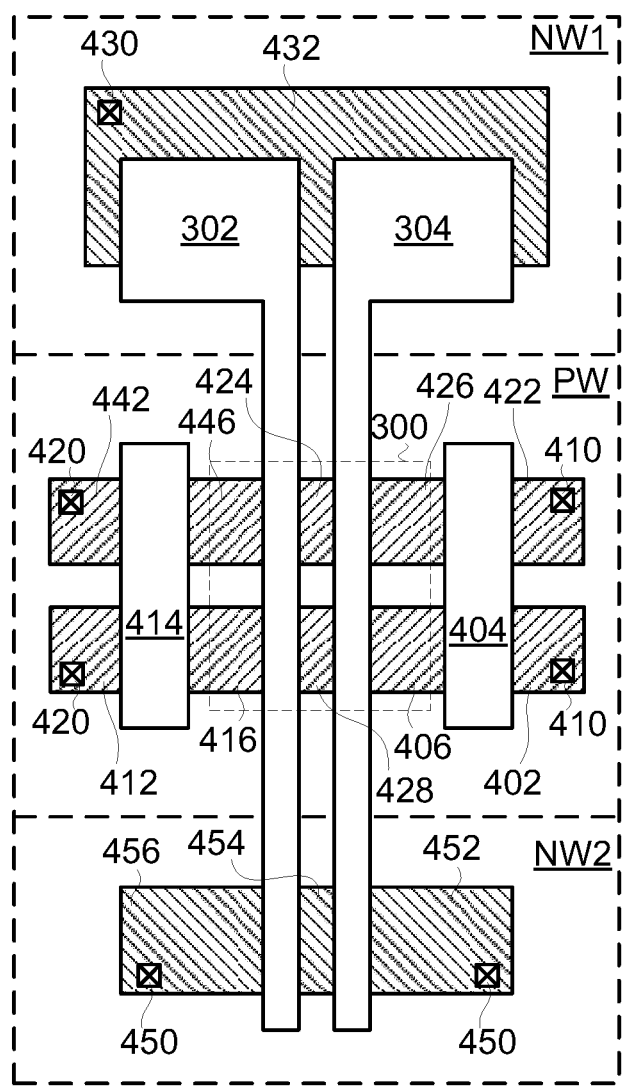
FIG. 4A is a schematic top view illustrating a memory cell of a non-volatile memory according to the second embodiment of the present invention.
Figures 4B, 4C:
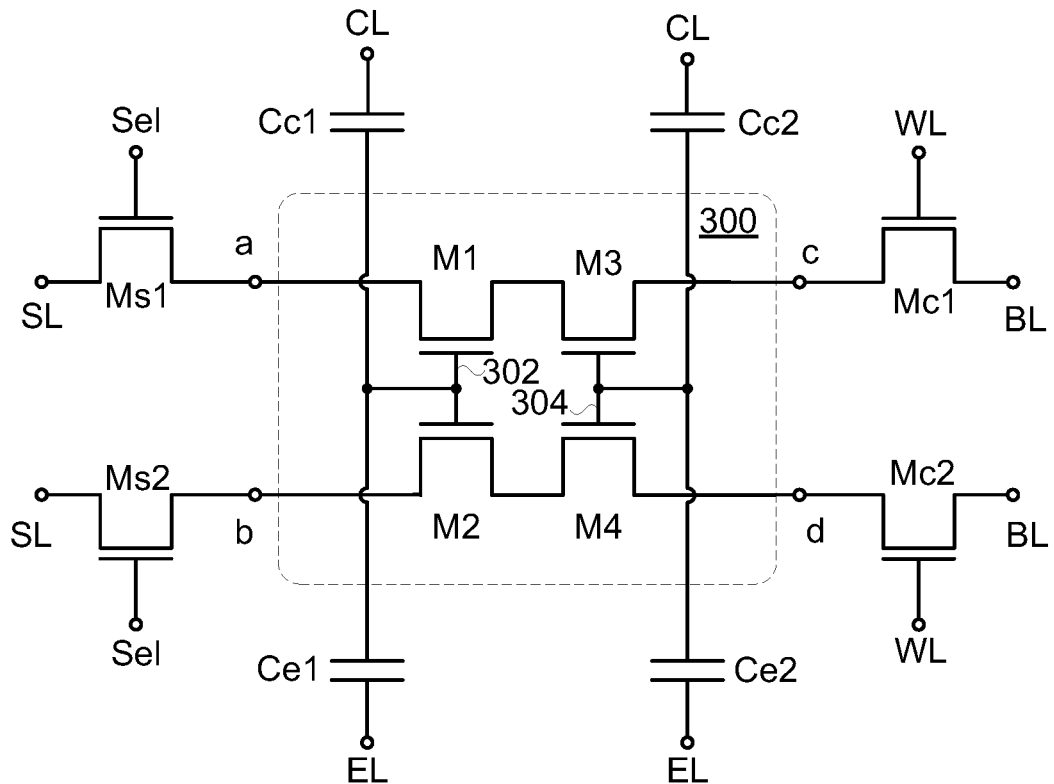
FIG. 4B is a circuit diagram illustrating an equivalent circuit of the memory cell according to the second embodiment of the present invention.
FIG. 4C is a bias voltage table illustrating the bias voltages for performing a program action, a program inhibition, an erase action and a read action on the memory cell of the non-volatile memory according to the second embodiment of the present invention.

FIG. 4A is a schematic top view illustrating a memory cell of a non-volatile memory according to the second embodiment of the present invention. FIG. 4B is a circuit diagram illustrating an equivalent circuit of the memory cell according to the second embodiment of the present invention. FIG. 4C is a bias voltage table illustrating the bias voltages for performing a program action, a program inhibition, an erase action and a read action on the memory cell of the non-volatile memory according to the second embodiment of the present invention. While each of the program action, the program inhibition, the erase action and the read action is performed, the p-well region PW receives the ground voltage (0V), the first n-well region NW1 and the control line CL receive the same voltage, and the second n-well region NW2 and the erase line EL receive the same voltage.

As shown in FIG. 4A, ten n-type doped regions 402, 406, 412, 416, 422, 424, 426, 428, 442 and 446 are formed in a p-well region PW.

A gate 404 is spanned over the n-type doped regions 422 and 426. Consequently, the gate 404 and the n-type doped regions 422 and 426 are collaboratively defined as a first control transistor Mc1. Moreover, the gate 404 is connected with a word line WL. A conductor line 410 is connected with the n-type doped region 422. Moreover, the conductor line 410 is used as a bit line BL. In an embodiment, the first control transistor Mc1 is an n-type transistor.

The gate 404 is also spanned over the n-type doped regions 402 and 406. Consequently, the gate 404 and the n-type doped regions 402 and 406 are collaboratively defined as a second control transistor Mc2. Moreover, the conductor line 410 is connected with the n-type doped region 402. Moreover, the conductor line 410 is used as the bit line BL. In an embodiment, the second control transistor Mc2 is an n-type transistor.

A gate 414 is spanned over the n-type doped regions 442 and 446. Consequently, the gate 414 and the n-type doped regions 442 and 446 are collaboratively defined as a first select transistor Ms1. Moreover, the gate 414 is connected with a select line Sel. A conductor line 420 is connected with the n-type doped region 442. Moreover, the conductor line 420 is used as a source line SL. In an embodiment, the first select transistor Ms1 is an n-type transistor.

The gate 414 is also spanned over the n-type doped regions 412 and 416. Consequently, the gate 414 and the n-type doped regions 412 and 416 are collaboratively defined as a second select transistor Ms2. The conductor line 420 is connected with the n-type doped region 412. Moreover, the conductor line 420 is used as the source line SL. In an embodiment, the second select transistor Ms2 is an n-type transistor.

The floating gate 302 is spanned over the n-type doped regions 446 and 424. Consequently, the floating gate 302 and the n-type doped regions 446 and 424 are collaboratively defined as the floating gate transistor M1.

The floating gate 302 is also spanned over the n-type doped regions 416 and 428. Consequently, the floating gate 302 and the n-type doped regions 416 and 428 are collaboratively defined as the floating gate transistor M2.

The floating gate 304 is spanned over the n-type doped regions 424 and 426. Consequently, the floating gate 304 and the n-type doped regions 424 and 426 are collaboratively defined as the floating gate transistor M3.

The floating gate 304 is also spanned over the n-type doped regions 428 and 406. Consequently, the floating gate 304 and the n-type doped regions 428 and 406 are collaboratively defined as the floating gate transistor M4. In other words, the region 300 as shown in FIG. 4A denotes the storage element of the memory cell.

Moreover, a p-type doped region 432 is formed in a first n-well region NW1. A conductor line 430 is connected with the p-type doped region 432. The conductor line 430 is used as a control line CL. The floating gate 302 and the p-type doped region 432 are collaboratively defined as a capacitor Cc1. A terminal of the capacitor Cc1 is connected with the control line CL. The other terminal of the capacitor Cc1 is connected with the floating gate 302.

Similarly, the floating gate 304 and the p-type doped region 432 are collaboratively defined as a capacitor Cc2. A terminal of the capacitor Cc2 is connected with the control line CL. The other terminal of the capacitor Cc2 is connected with the floating gate 304.

Moreover, p-type doped regions 452, 454 and 456 are formed in a second n-well region NW2. A conductor line 450 is connected with the p-type doped regions 452 and 456. The conductor line 450 is used as an erase line EL.

The floating gate 302 and the p-type doped regions 456 and 454 are collaboratively defined as a capacitor Ce1. A terminal of the capacitor Ce1 is connected with the erase line EL. The other terminal of the capacitor Ce1 is connected with the floating gate 302.

Similarly, the floating gate 304 and the p-type doped regions 454 and 452 are collaboratively defined as a capacitor Ce2. A terminal of the capacitor Ce2 is connected with the erase line EL. The other terminal of the capacitor Ce2 is connected with the floating gate 304.

Please refer to the equivalent circuit of FIG. 4B. The first source/drain terminal of the first control transistor Mc1 is connected with the bit line BL. The gate of the first control transistor Mc1 is connected with the word line WL. The second source/drain terminal of the first control transistor Mc1 is connected with the third terminal c of the storage element 300. The first source/drain terminal of the second control transistor Mc2 is connected with the bit line BL. The gate of the second control transistor Mc2 is connected with the word line WL. The second source/drain terminal of the second control transistor Mc2 is connected with the fourth terminal d of the storage element 300.

The first source/drain terminal of the first select transistor Ms1 is connected with the source line SL. The gate of the first select transistor Ms1 is connected with the select line Sel. The second source/drain terminal of the first select transistor Ms1 is connected with the first terminal a of the storage element 300. The first source/drain terminal of the second select transistor Ms2 is connected with the source line SL. The gate of the second select transistor Ms2 is connected with the select line Sel. The second source/drain terminal of the second select transistor Ms2 is connected with the second terminal b of the storage element 300.

The capacitor Cc1 is connected between the floating gate 302 and the control line CL. The capacitor Cc2 is connected between the floating gate 304 and the control line CL. The capacitor Ce1 is connected between the floating gate 302 and the erase line EL. The capacitor Ce2 is connected between the floating gate 304 and the erase line EL.

FIG. 4C is a bias voltage table illustrating the bias voltages for performing a program action, a program inhibition, an erase action and a read action on the selected memory cell. The bias voltage table of FIG. 4C is similar to that of FIG. 2C. The operations of the memory cell of the second embodiment are similar to those of the first embodiment, and are not redundantly described herein.

In the above two embodiments, the storage element in the memory cell comprises four floating gate transistors. Consequently, the reliability of the memory cell is enhanced. It is noted that numerous modifications and alterations may be made while retaining the teachings of the invention. For example, in some embodiments, the storage element in the memory cell comprises more than four floating gate transistors.

Figure 5A:
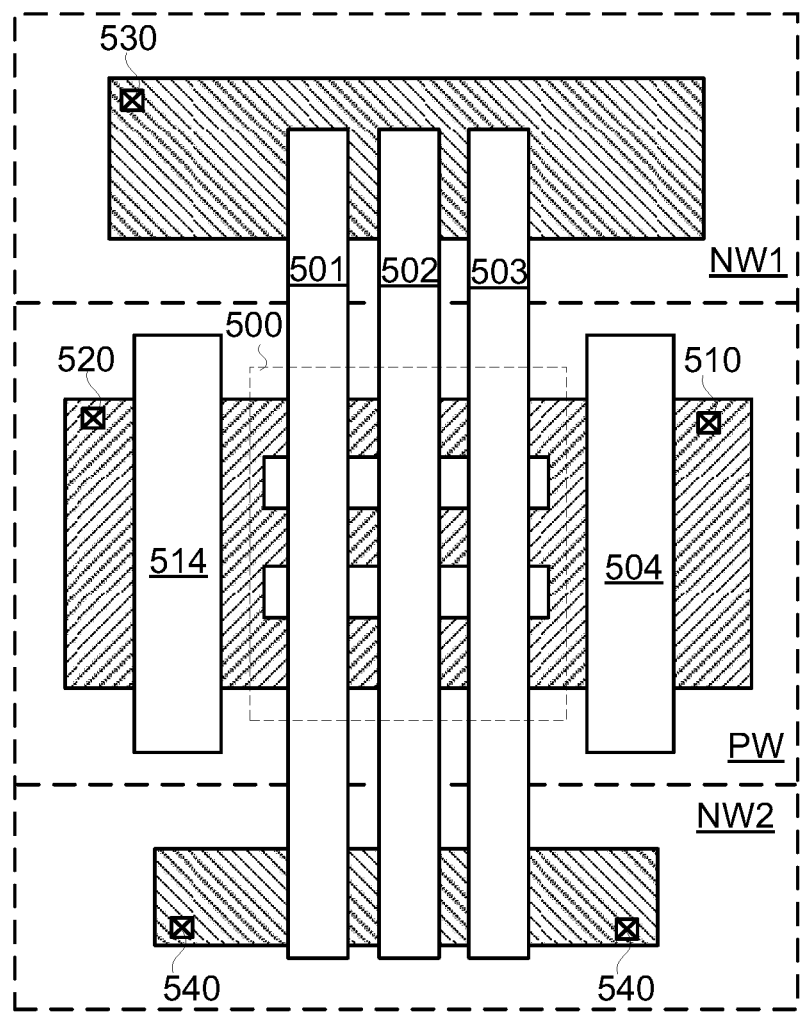
FIG. 5A is a schematic top view illustrating a memory cell of a non-volatile memory according to a third embodiment of the present invention.
Figure 5B:
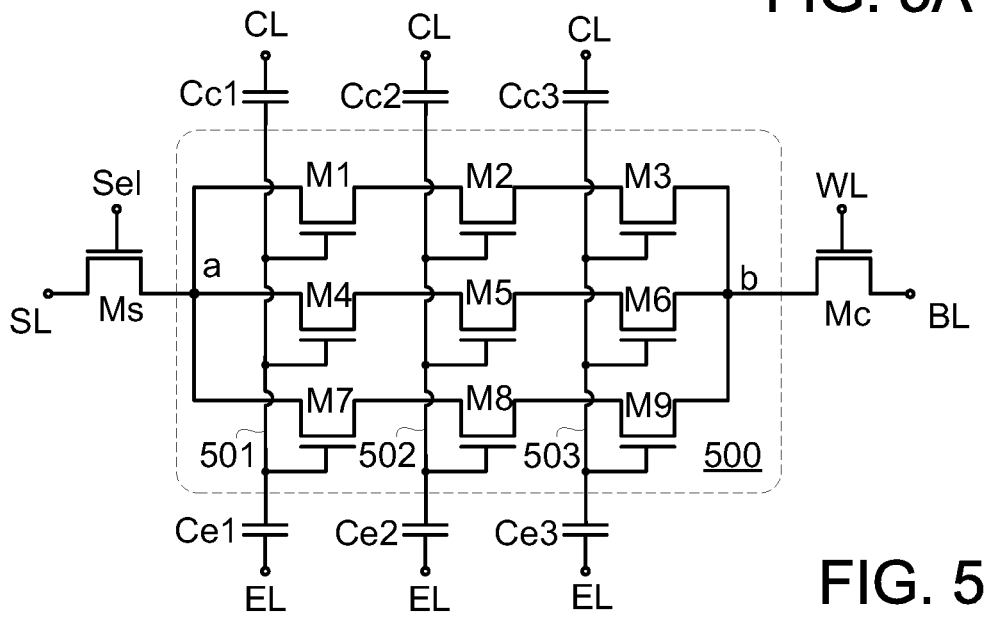
FIG. 5B is a circuit diagram illustrating an equivalent circuit of the memory cell according to the third embodiment of the present invention.

FIG. 5A is a schematic top view illustrating a memory cell of a non-volatile memory according to a third embodiment of the present invention. FIG. 5B is a circuit diagram illustrating an equivalent circuit of the memory cell according to the third embodiment of the present invention. In this embodiment, the storage element comprises nine floating gate transistors.

As shown in FIG. 5A, the regions in the p-well region PW and indicated by oblique lines are n-type doped regions, and the regions in the n-well regions NW1 and NW2 and indicated by oblique lines are p-type doped regions. A gate 504 is connected with a word line WL. A gate 514 is connected with a select line Sel. A conductor line 510 is used as a bit line BL. A conductor line 520 is used as a source line SL. A conductor line 530 is used as a control line CL. A conductor line 540 is used as an erase line EL.

In this embodiment, three floating gates 501, 502 and 503 are extended from the p-type doped region of the first n-well region NW1 to the p-type doped regions of the second n-well region NW2 through the n-type doped regions of the p-well region PW. Consequently, the storage element 500 with nine floating gate transistors is produced.

Please refer to the equivalent circuit of FIG. 5B. The storage element 500 comprises 3×3 floating gate transistors M1-M9. The three floating gate transistors M1, M2 and M3 in the first row are serially connected between a first terminal a and a second terminal b of the storage element 500. The three floating gate transistors M4, M5 and M6 in the second row are serially connected between the first terminal a and the second terminal b of the storage element 500. The three floating gate transistors M7, M8 and M9 in the third row are serially connected between the first terminal a and the second terminal b of the storage element 500. The first floating gate transistors M1, M4 and M7 in each row have a shared floating gate 501. The second floating gate transistors M2, M5 and M8 in each row have a shared floating gate 502. The third floating gate transistors M3, M6 and M9 in each row have a shared floating gate 503.

The first source/drain terminal of the control transistor Mc is connected with the bit line BL. The gate of the control transistor Mc is connected with the word line WL. The second source/drain terminal of the control transistor Mc is connected with the second terminal b of the storage element 500. The first source/drain terminal of the select transistor Ms is connected with the source line SL. The gate of the select transistor Ms is connected with the select line Sel. The second source/drain terminal of the select transistor Ms is connected with the first terminal a of the storage element 500. The capacitor Cc1 is connected between the floating gate 501 and the control line CL. The capacitor Cc2 is connected between the floating gate 502 and the control line CL. The capacitor Cc3 is connected between the floating gate 503 and the control line CL. The capacitor Ce1 is connected between the floating gate 501 and the erase line EL. The capacitor Ce2 is connected between the floating gate 502 and the erase line EL. The capacitor Ce3 is connected between the floating gate 503 and the erase line EL.

The method of biasing the memory cell of the third embodiment is similar to that of the first embodiment, and is not redundantly described herein.

Figure 6A:
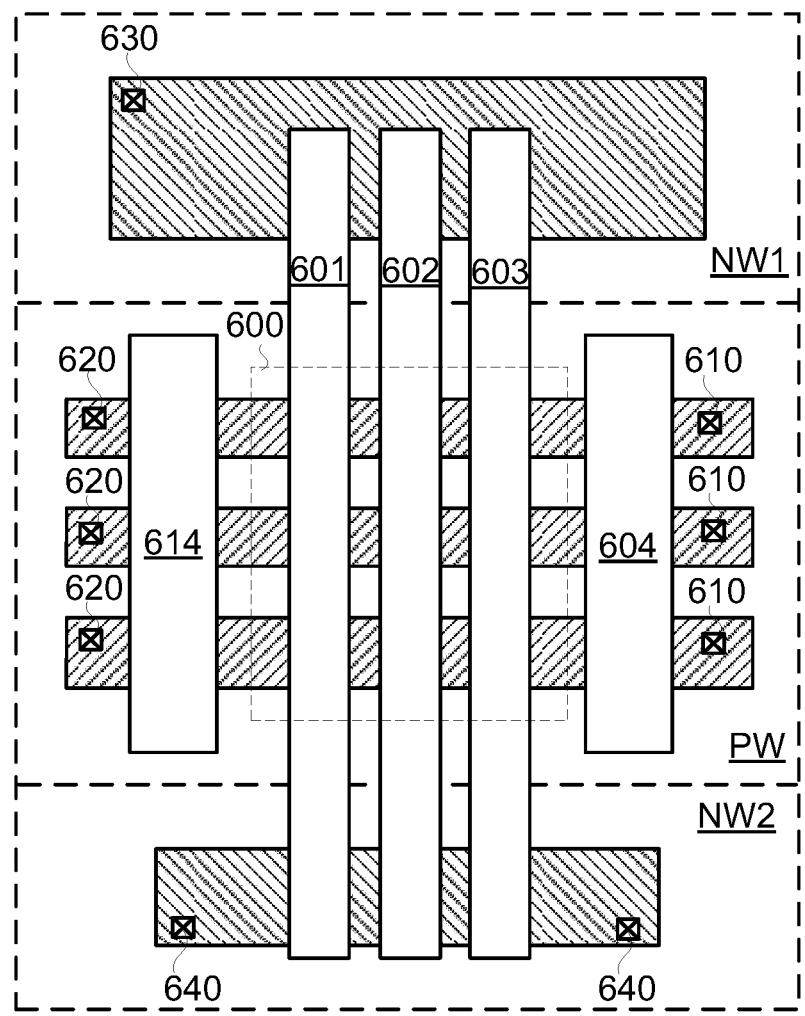
FIG. 6A is a schematic top view illustrating a memory cell of a non-volatile memory according to a fourth embodiment of the present invention.
Figure 6B:
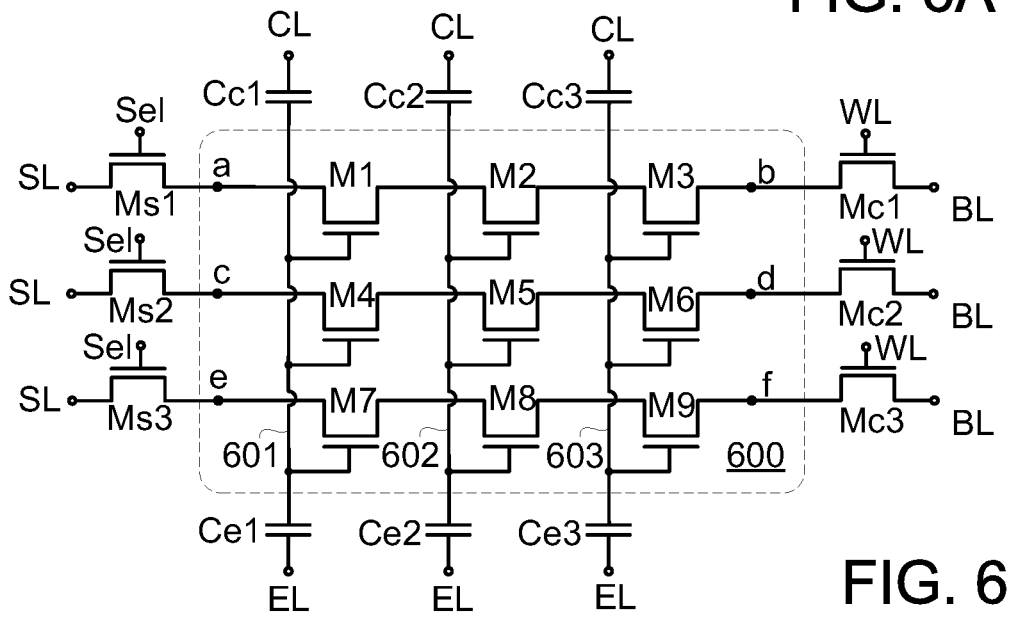
FIG. 6B is a circuit diagram illustrating an equivalent circuit of the memory cell according to the fourth embodiment of the present invention.

FIG. 6A is a schematic top view illustrating a memory cell of a non-volatile memory according to a fourth embodiment of the present invention. FIG. 6B is a circuit diagram illustrating an equivalent circuit of the memory cell according to the fourth embodiment of the present invention. In this embodiment, the storage element comprises nine floating gate transistors.

As shown in FIG. 6A, the regions in the p-well region PW and indicated by oblique lines are n-type doped regions, and the regions in the n-well regions NW1 and NW2 and indicated by oblique lines are p-type doped regions. A gate 604 is connected with a word line WL. A gate 614 is connected with a select line Sel. A conductor line 610 is used as a bit line BL. A conductor line 620 is used as a source line SL. A conductor line 630 is used as a control line CL. A conductor line 640 is used as an erase line EL.

The first source/drain terminal of the first control transistor Mc1 is connected with the bit line BL. The gate of the first control transistor Mc1 is connected with the word line WL. The second source/drain terminal of the first control transistor Mc1 is connected with the second terminal b of the storage element 600. The first source/drain terminal of the second control transistor Mc2 is connected with the bit line BL. The gate of the second control transistor Mc2 is connected with the word line WL. The second source/drain terminal of the second control transistor Mc2 is connected with the fourth terminal d of the storage element 600. The first source/drain terminal of the second control transistor Mc3 is connected with the bit line BL. The gate of the second control transistor Mc3 is connected with the word line WL. The second source/drain terminal of the second control transistor Mc3 is connected with the sixth terminal f of the storage element 600.

The first source/drain terminal of the first select transistor Ms1 is connected with the source line SL. The gate of the first select transistor Ms1 is connected with the select line Sel. The second source/drain terminal of the first select transistor Ms1 is connected with the first terminal a of the storage element 600. The first source/drain terminal of the second select transistor Ms2 is connected with the source line SL. The gate of the second select transistor Ms2 is connected with the select line Sel. The second source/drain terminal of the second select transistor Ms2 is connected with the third terminal c of the storage element 600. The first source/drain terminal of the second select transistor Ms3 is connected with the source line SL. The gate of the second select transistor Ms3 is connected with the select line Sel. The second source/drain terminal of the second select transistor Ms3 is connected with the fifth terminal e of the storage element 600.

The capacitor Cc1 is connected between the floating gate 601 and the control line CL. The capacitor Cc2 is connected between the floating gate 602 and the control line CL. The capacitor Cc3 is connected between the floating gate 603 and the control line CL. The capacitor Ce1 is connected between the floating gate 601 and the erase line EL. The capacitor Ce2 is connected between the floating gate 602 and the erase line EL. The capacitor Ce3 is connected between the floating gate 603 and the erase line EL.

The method of biasing the memory cell of the fourth embodiment is similar to that of the third embodiment, and is not redundantly described herein.

As mentioned above, the storage element of the non-volatile memory comprises p×q floating gate transistors. That is, the storage element comprises p rows of floating gate transistors, wherein each row comprises q serially-connected floating gate transistors.

Moreover, the first floating gate transistors in each row have a shared floating gate. The second floating gate transistors in each row have a shared floating gate. The q-th floating gate transistors in each row have a shared floating gate. The rest may be deduced by analogy. That is, the x-th floating gate transistors in each row share an x-th floating gate, wherein x is an integer, and $1 \leq x \leq q$.

In another embodiment, the q floating gate transistors in the y-th row are serially connected between a (2y−1)-th terminal and a (2y)-th terminal of the storage element, wherein y is an integer, and $1 \leq y \leq p$.

In the above embodiments, the floating gate transistors, the control transistor and the select transistors are n-type transistors. It is noted that numerous modifications and alterations may be made while retaining the teachings of the invention. For example, in another embodiment, the floating gate transistors, the control transistor and the select transistors are p-type transistors. Similarly, the capacitors Cc1, Cc2, Ce1 and Ce2 may be implemented with n-type transistors or p-type transistors.

Moreover, in the storage element 100 or 300 of the first embodiment and the second embodiment, the floating gate transistors M1 and M4 may specially designed to have long channel length and the floating gate transistors M3 and M2 may be specially designed to have short channel length. That is, the channel length of the floating gate transistor M1 is larger than the channel length of the floating gate transistor M3, and the channel length of the floating gate transistor M4 is larger than the channel length of the floating gate transistor M2. Consequently, during the read action, the resistance values of the floating gate transistor M3 and the floating gate transistor M2 are reduced and the magnitude of the read current is increased. Under this circumstance, the storage state of the memory cell can be judged more accurately.

In the storage elements 500 and 600 of the third embodiment and the fourth embodiment, the floating gate transistors M1, M5 and M9 may specially designed to have long channel length and the floating gate transistors M2, M3, M4, M6, M7 and M8 may be specially designed to have short channel length.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A non-volatile memory comprising a memory cell, the memory cell comprising a storage element, the storage element comprising:
    a first floating gate transistor comprising a first floating gate, a first source/drain terminal and a second source/drain terminal;
    a second floating gate transistor comprising the first floating gate, a third source/drain terminal and a fourth source/drain terminal;
    a third floating gate transistor comprising a second floating gate, a fifth source/drain terminal and a sixth source/drain terminal; and
    a fourth floating gate transistor comprising the second floating gate, a seventh source/drain terminal and an eighth source/drain terminal,
    wherein the second source/drain terminal is connected with the fifth source/drain terminal, and the fourth source/drain terminal is connected with the seventh source/drain terminal;
    wherein the first floating gate transistor has a first channel length, the second floating gate transistor has a second channel length, the third floating gate transistor has a third channel length, and the fourth floating gate transistor has a fourth channel length, wherein the first channel length is larger than the third channel length, and the fourth channel length is larger than the second channel length.

2. A non-volatile memory comprising a memory cell, the memory cell comprising a storage element, the storage element comprising:
    a first floating gate transistor comprising a first floating gate, a first source/drain terminal and a second source/drain terminal;
    a second floating gate transistor comprising the first floating gate, a third source/drain terminal and a fourth source/drain terminal;
    a third floating gate transistor comprising a second floating gate, a fifth source/drain terminal and a sixth source/drain terminal; and
    a fourth floating gate transistor comprising the second floating gate, a seventh source/drain terminal and an eighth source/drain terminal,
    wherein the second source/drain terminal is connected with the fifth source/drain terminal, and the fourth source/drain terminal is connected with the seventh source/drain terminal;
    wherein the memory cell further comprises: a control transistor comprising a first gate, a ninth source/drain terminal and a tenth source/drain terminal, wherein the first gate is connected with a word line, the ninth source/drain terminal is connected with a bit line, and the tenth source/drain terminal is connected with the sixth source/drain terminal and the eighth source/drain terminal.

3. A non-volatile memory comprising a memory cell, the memory cell comprising a storage element, the storage element comprising:
    a first floating gate transistor comprising a first floating gate, a first source/drain terminal and a second source/drain terminal;
    a second floating gate transistor comprising the first floating gate, a third source/drain terminal and a fourth source/drain terminal;
    a third floating gate transistor comprising a second floating gate, a fifth source/drain terminal and a sixth source/drain terminal; and
    a fourth floating gate transistor comprising the second floating gate, a seventh source/drain terminal and an eighth source/drain terminal,
    wherein the second source/drain terminal is connected with the fifth source/drain terminal, and the fourth source/drain terminal is connected with the seventh source/drain terminal;
    wherein the memory cell further comprises: a select transistor comprising a first gate, a ninth source/drain terminal and a tenth source/drain terminal, wherein the first gate is connected with a select line, the ninth source/drain terminal is connected with a source line, and the tenth source/drain terminal is connected with the first source/drain terminal and the third source/drain terminal.

4. The non-volatile memory as claimed in claim 3, wherein the memory cell further comprises a first capacitor and a second capacitor, the first capacitor is connected between the first floating gate and a control line, and the second capacitor is connected between the second floating gate and the control line.

5. A non-volatile memory comprising a memory cell, the memory cell comprising a storage element, the storage element comprising:
    a first floating gate transistor comprising a first floating gate, a first source/drain terminal and a second source/drain terminal;
    a second floating gate transistor comprising the first floating gate, a third source/drain terminal and a fourth source/drain terminal;
    a third floating gate transistor comprising a second floating gate, a fifth source/drain terminal and a sixth source/drain terminal; and a fourth floating gate transistor comprising the second floating gate, a seventh source/drain terminal and an eighth source/drain terminal, wherein the second source/drain terminal is connected with the fifth source/drain terminal, and the fourth source/drain terminal is connected with the seventh source/drain terminal;

wherein the memory cell further comprises a first capacitor and a second capacitor, the first capacitor is connected between the first floating gate and an erase line, and the second capacitor is connected between the second floating gate and the erase line.

* * * * *